United States Patent [19]

Stifter

[11] Patent Number: 4,500,853
[45] Date of Patent: Feb. 19, 1985

[54] OSCILLATOR PHASE LOCK SYSTEM

[75] Inventor: Francis J. Stifter, Natick, Mass.

[73] Assignee: Electronic Specialists, Natick, Mass.

[21] Appl. No.: 590,899

[22] Filed: Mar. 19, 1984

Related U.S. Application Data

[62] Division of Ser. No. 548,517, Nov. 3, 1983.

[51] Int. Cl.³ .............................................. H03L 7/08
[52] U.S. Cl. ........................................ 331/18; 331/21; 331/26; 331/34; 331/111; 331/153; 331/172
[58] Field of Search .................... 331/1 R, 14, 18, 21, 331/25, 26, 34, 111, 145, 149, 153, 172, 173, 20

[56] References Cited

U.S. PATENT DOCUMENTS

| | | | |
|---|---|---|---|
| 3,204,197 | 8/1965 | Marzan | 331/1 R X |
| 3,873,766 | 3/1975 | Maeda | 331/20 X |
| 4,468,637 | 8/1984 | Wray et al. | 331/172 X |

Primary Examiner—Siegfried H. Grimm
Attorney, Agent, or Firm—John E. Toupal; Harold G. Jarcho

[57] ABSTRACT

A phase-lock system including an oscillator providing a switching output that continuously switches between first and second states, a trigger circuit for inducing switching of the oscillator, a sensing circuit monitoring the switching output and providing an anticipating indication of an imminent switching thereof from the first to the second state, and a primary voltage source providing a variable voltage that periodically varies from and returns to a given voltage level. Also included is a detector circuit monitoring the variable voltage and detecting the presence of the given voltage level and a synchronizing circuit responsive to the sensing and detector circuits and providing an input to the trigger circuit, the synchronizing circuit being operative to cause switching of the oscillator in response to the simultaneous provision of the anticipating indication by the sensing circuit and detection of the given level by the detector circuit.

15 Claims, 8 Drawing Figures

OSCILLATOR PHASE LOCK SYSTEM

CROSS-REFERENCE TO RELATED APPLICATION

This invention is a division of U.S. application Ser. No. 548,517, filed Nov. 3, 1983, entitled "Uninterruptible Power Supply".

BACKGROUND OF THE INVENTION

This invention relates generally to a phase-lock system and, more particularly, to a system in which a slave signal is phase-locked to a master signal during a predetermined phase interval of the slave signal.

Phase-lock systems are used in many applications to produce phase coincidence between master and slave signals. One common application is coherent radar in which a reference signal is phase-locked to a transmitted signal and then phase-compared to an echo signal. Other applications involve standby and uninterruptible power supplies, television color control circuits, laboratory measurement and instruction instruments, etc. Typically, phase-lock is accomplished by electronically forcing a slave signal into phase with a master signal. That technique frequently entails a substantial phase-shifting of the slave signal and results in a transient disruption thereof. Such disruptions, even though momentary, can be undesirable under certain circumstances.

The object of the invention, therefore, is to provide an improved phase-lock system.

SUMMARY OF THE INVENTION

The invention is a phase-lock system including an oscillator providing a switching output that continuously switches between first and second states, a trigger circuit for inducing switching of the oscillator, a sensing circuit monitoring the switching output and providing an anticipating indication of an imminent switching thereof from the first to the second state, and a primary voltage source providing a variable voltage that periodically varies from and returns to a given voltage level. Also included is a detector circuit monitoring the variable voltage and detecting the presence of the given voltage level and a synchronizing circuit responsive to the sensing and detector circuits and providing an input to the trigger circuit, the sychronizing circuit being operative to cause switching of the oscillator in response to the simultaneous provision of the anticipating indication by the sensing circuit and detection of the given level by the detector circuit. The system produces phase-lock only at a predetermined phase interval of the oscillator's switching output.

According to certain features of the invention the system includes a filter output receiving the switching output and producing therewith a sine wave output, the variable voltage is a sine wave voltage, and the given level is zero. This arrangement produces highly efficient phase-lock at zero-crossings of the oscillator's switching output.

According to other features of the invention the oscillator comprises a timing circuit for determining the periods of the first and second states and including a timing capacitor having one end connected to the switching output by timing resistor means and an opposite end connected to a trigger resistor, and the trigger circuit comprises an electronic switch activatable to produce current flow through the trigger resistor. The electronic switch is activated by the input from the synchronizing circuit to produce a given voltage across the timing capacitor and the trigger resistor and thereby causes switching of the oscillator.

According to still other features of the invention, the oscillator comprises an operational amplifier with an output providing the switching output and one input connected to the one end of the timing capacitor and the sensing circuit comprises a threshold means for producing the anticipating indication as an early transition signal in response to a predetermined voltage across the timing capacitor and the trigger resistor. The predetermined voltage preferably is slightly less than the given voltage so as to anticipate imminent switching of the oscillator output.

According to yet other features of the invention, the detector circuit comprises means for producing a crossover pulse in response to certain zero-crossings of the a.c. voltage, the transition signal is a transition pulse and the synchronizing circuit comprises an "and" gate for providing the input as a sync pulse in response to the simultaneous reception of a transition pulse and a crossover pulse. The electronic switch comprises a transistor triggered into conduction by the sync pulse.

DESCRIPTION OF THE DRAWINGS

These and other objects and features of the invention will become more apparent upon a perusal of the following description taken in conjunction with the accompanying drawings wherein.

DESCRIPTION OF THE PREFERRED EMBODIMENT

Figure 1:
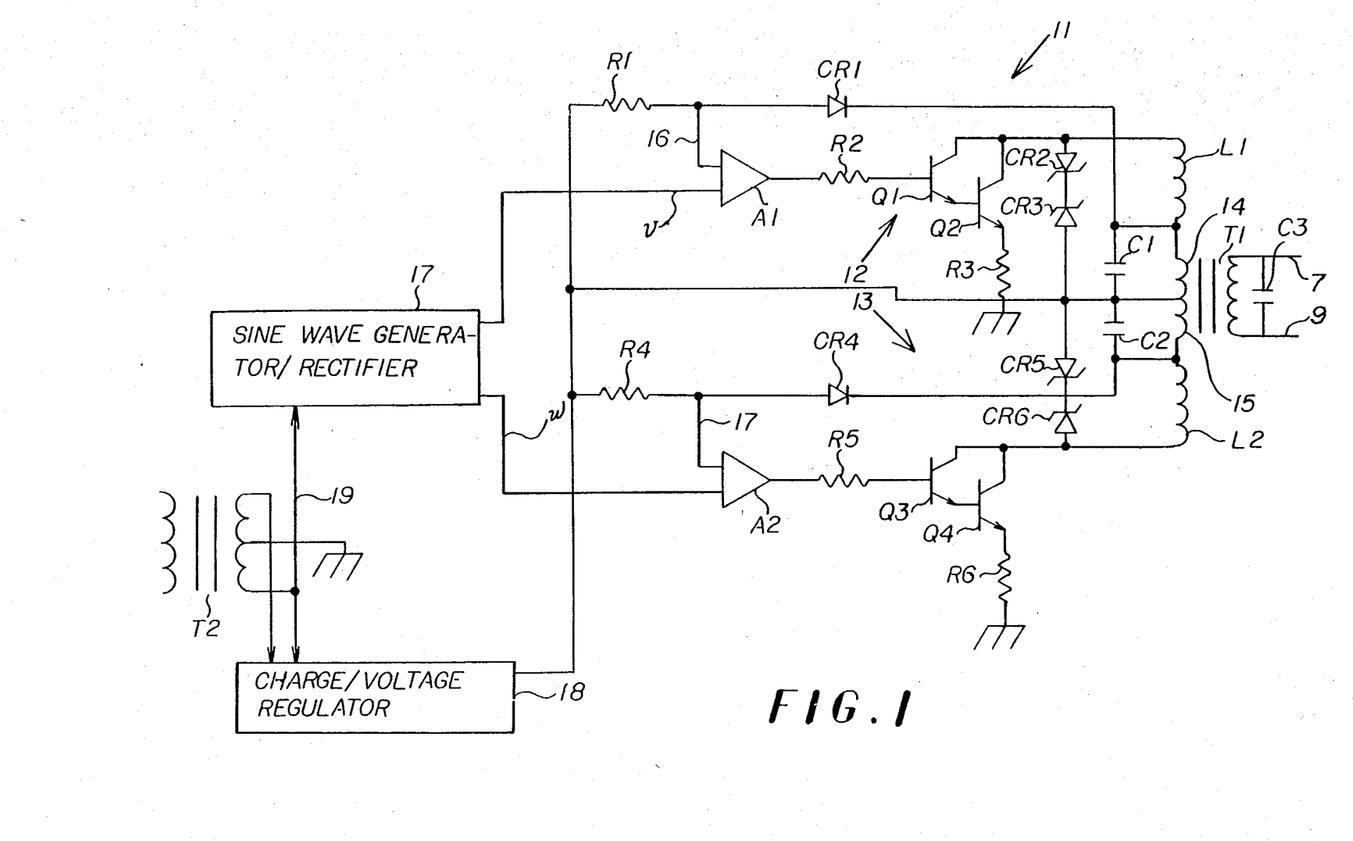
FIG. 1 is a schematic circuit diagram of an uninterruptible power supply employing a phase-lock system according to the invention.

Illustrated in FIG. 1 is a switching circuit 11 that provides on lines 7, 9 an AC output for connection to a suitable load (not shown). Included in the switching circuit 11 are identical first and second switching circuits 12, 13 that produce, respectively, predetermined current waveforms in output primary windings 14, 15 of a transformer T1. The first switching circuit 12 includes an operational amplifier A1 that receives a detected output voltage on one input 16 and on another input v a half cycle reference sine wave produced by a sine wave generator/rectifier 17. Receiving the output of the amplifier A1 via a resistor R2 is a transistor pair Q1, Q2 that controls current flow through an electrical energy storage inductor L1 and the primary winding 14. Additional electrical energy storage is provided by a capacitor C1 which also filters the output produced across the winding 14. Connected across the inductor L1 and the output winding 14 are a pair of oppositely connected free-wheeling zener diodes CR2, CR3. The identical second switching circuit 13 also includes an operational amplifier A2 that receives a detected output voltage on one input 17 and on an input w an opposite half cycle sine wave from the generator/rectifier 17. The output of the amplifier A2 is applied through a resistor R5 to a pair of transistors Q3, Q4 that control current flow through an inductor L2 and the output transformer winding 15. Again, the output across the winding 15 is filtered by a capacitor C2 and a pair of oppositely connected zener diodes C5, C6 are connected across the winding 15 and the inductor L2. A regulated voltage input for the switching circuit 11 is provided by a charge/voltage regulator 18 that receives power from the secondary of a transformer T2 having a primary winding connected to a suitable AC supply. The secondary of the transformer T2 also provides on a signal line 19 a phase lock signal to the sine wave/rectifier 17. A more detailed operational description of the switching circuit 11 will be given hereinafter.

Figure 2:
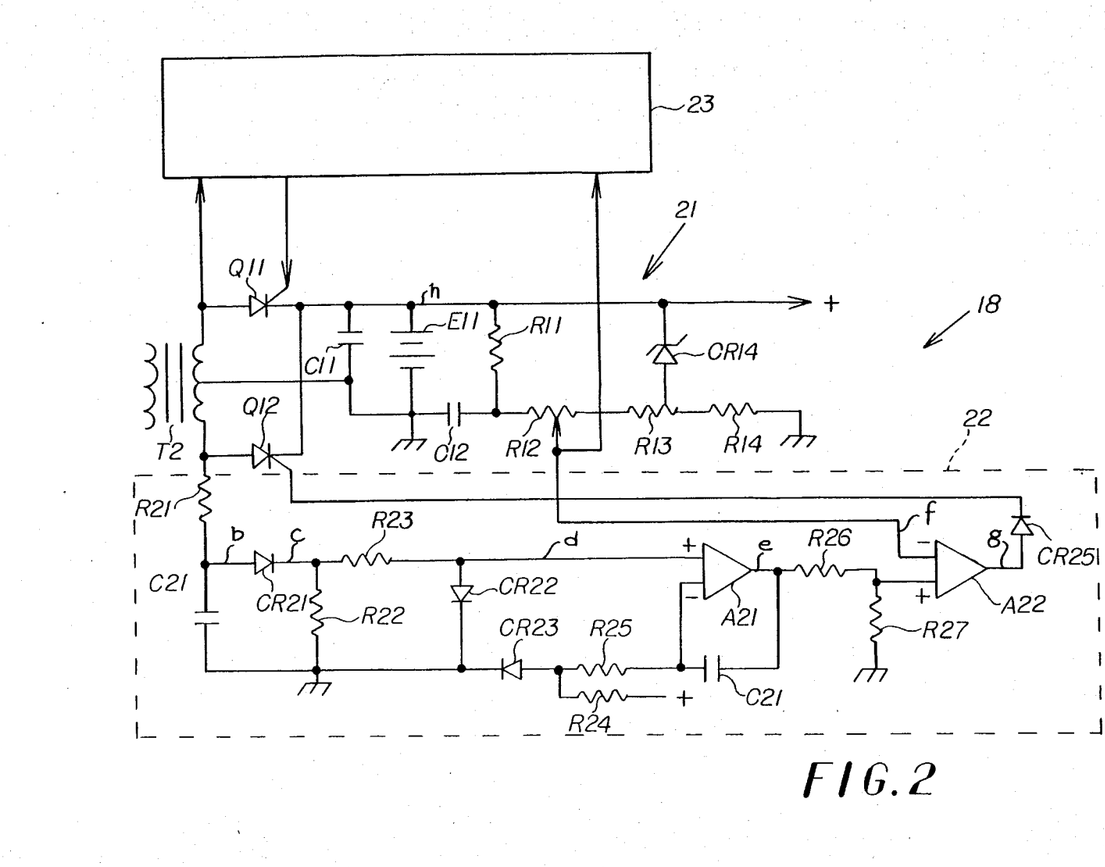
FIG. 2 is a detailed schematic circuit diagram of a charge-voltage regulator block shown in FIG. 1.

FIG. 2 illustrates in greater detail the charge/voltage regulator 18 shown in FIG. 1. The transformer T2 supplies power to a regulating voltage output circuit 21 including a battery 11; capacitors C11, C12; resistors R11–R14; and a diode CR14. As described more fully below, the voltage output of the circuit 21 is regulated by a pair of SCRs Q11, Q12. Controlling the SCR Q12 is a control circuit 22 including resistors R21–R27; a capacitor C21; diodes CR21–CR25; and a pair of operational amplifiers A21, A22. The SCR Q11 is similarly controlled by an identical control circuit 23.

Figure 3:
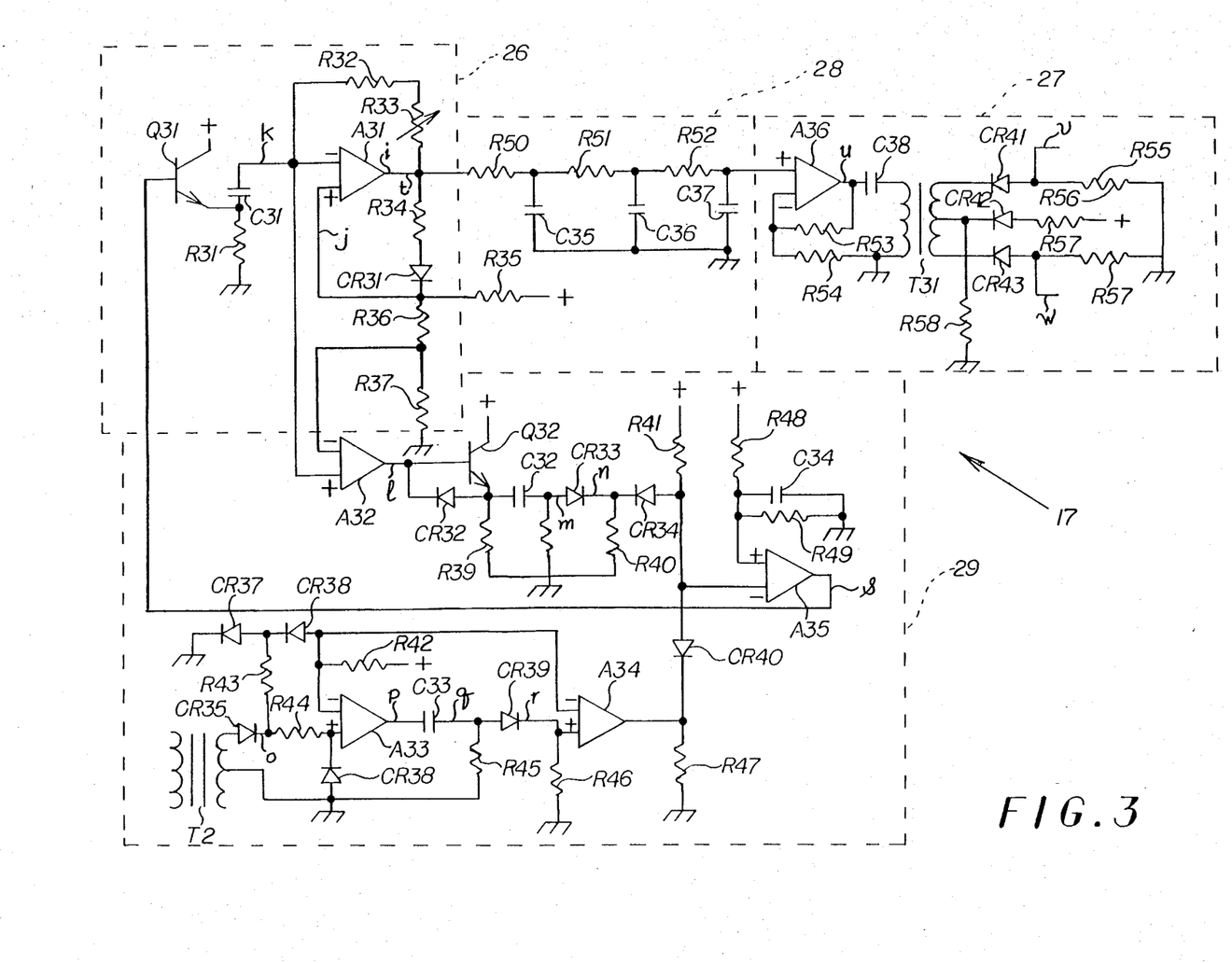
FIG. 3 is a detailed schematic circuit diagram of a sine wave generator block shown in FIG. 1.

FIG. 3 shows in greater detail the sine wave generator/rectifier 17 shown in FIG. 1. Included in the generator circuit 17 is a free running oscillator 26 that supplies a split rectifier 27 through a filter circuit 28. The oscillator 26 includes resistors R32–R35; an operational amplifier A31; and a diode CR31. Composing the filter circuit are resistors R50–R52 and capacitors C35–C37. The split rectifier 27 includes a transformer T31; an operational amplifier A36; resistors R53–R58; a capacitor C38; and diodes C41–C43. Also included in the sine wave generator/rectifier circuit 17 is a crossover phase lock circuit 29 that includes operational amplifiers A32–A35; resistors R31 and R41–R48; capacitors C32–C34; diodes CR32–CR40, and a transistor Q32.

OPERATION

Figure 5:
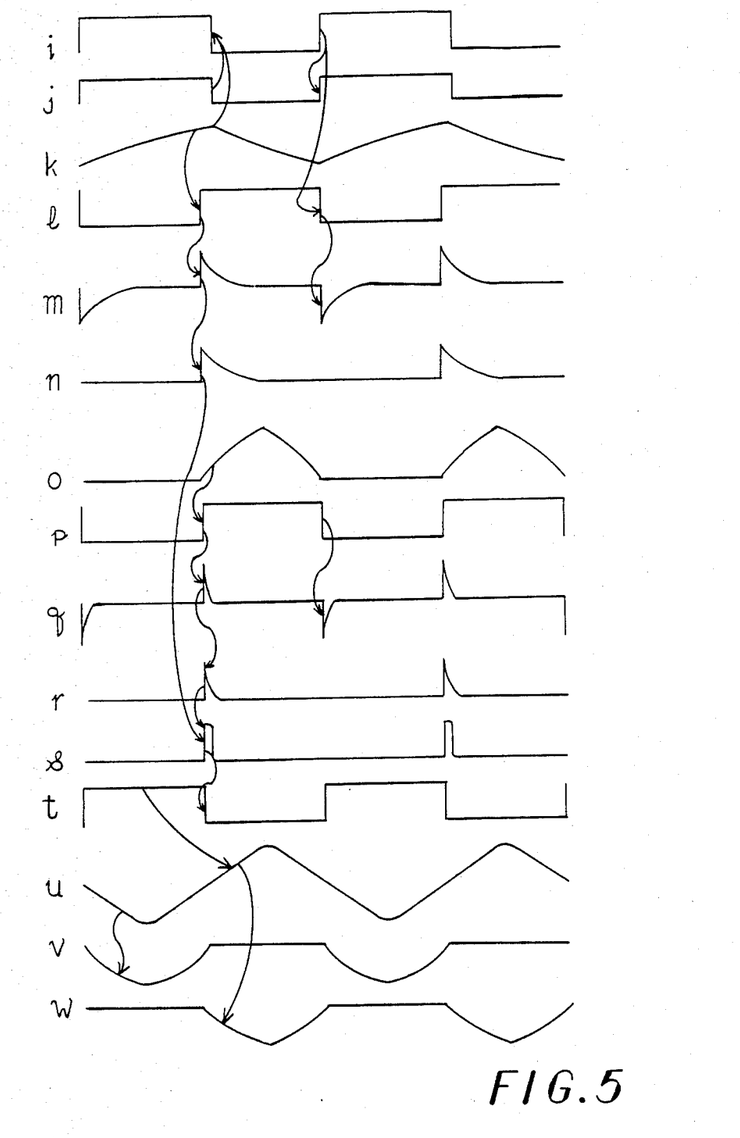
FIG. 5 is a schematic diagram illustrating various voltage waveforms produced in the circuits shown in FIGS. 1 and 3.

As described below a sine wave is generated with the generator/rectifier 17 of FIG. 1 and a split rectifier therein separates the sine wave into two negative half cycle waveforms which function as reference voltages for the comparators A1 and A2. Assume that a negative half wave (waveform v in FIG. 5) is present at the input of the comparator amplifier A1. At the beginning of the waveform the input (−) is more negative than the (+) input at 16 resulting in amplifier A1 output going high. The transistors Q1 and Q2 are switched "on", going into saturation and drawing current through the inductor L1. This reduces the voltage across the capacitor C1 and the transformer winding 14. When the voltage at the capacitor C1 is reduced such that the (+) amplifier input at 16 is more negative than the waveform input v the transistors Q1 and Q2 are switched "off". Rapid change of current in the inductor L1 current results in an "inductive kick" which is snubbed by the zener diodes CR2 and CR3. Since the waveform v is continuing in a negative direction, the (−) amplifier input will quickly become more negative than the (+) input and transistors Q1, Q2 will again be switched "on" to further reduce the voltage across the capacitor C1. This alternate switching action will occur many times during the negative half cycle, developing a voltage across the transformer winding 14 that closely tracks the reference waveform v. During the next half cycle, the waveform w, FIG. 5, is impressed on the (−) input of comparator amplifier A2 similarly switching the transistors Q3, Q4. Accordingly, the voltage across the capacitor C2 is made to follow the waveform w, developing a tracking voltage across the transformer winding 15. These alternating sine wave half cycles developed, respectively, across the windings 14, 15 combine to form a full sine wave output for the transformer T1.

Figure 4:
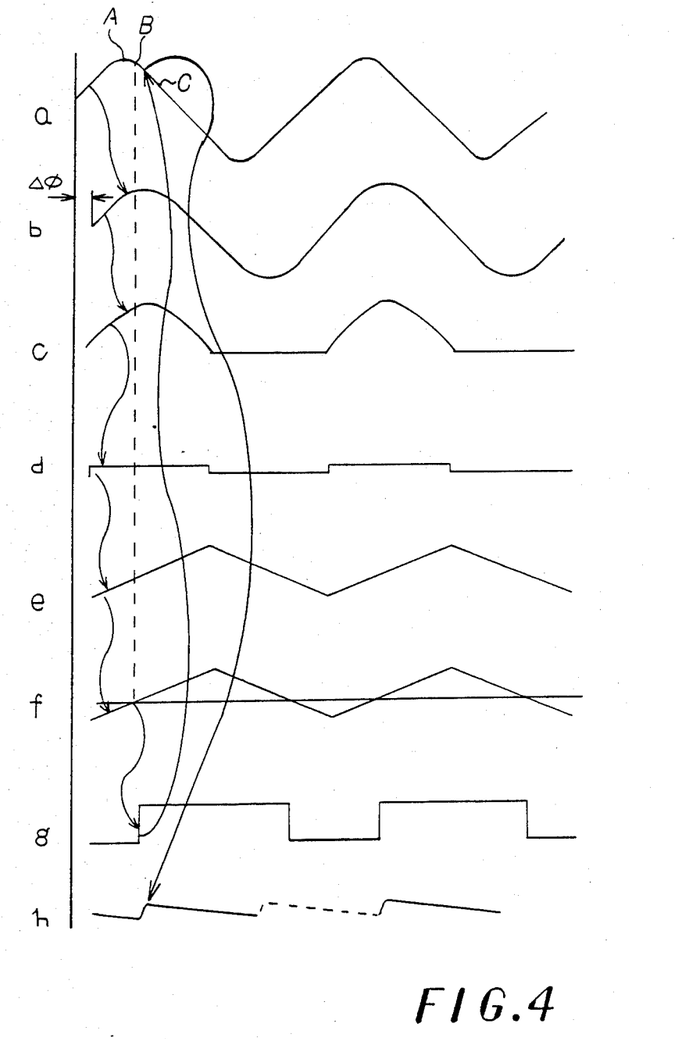
FIG. 4 is a schematic diagram illustrating various waveforms generated in the charge-voltage regulator shown in FIG. 2.

Power for basic uninterruptible operation of the circuit 11 is drawn from the battery E11 in the charge/voltage regulator 18 (FIG. 2) which is provided to accommodate a wide range of commercial line voltages. Waveforms depicting operation of the charge/voltage regulator are shown in FIG. 4. Secondary voltage a from the Transformer T2 is phase shifted by the RC network R21, C21 as shown in the waveform b. This phase shifted voltage is rectified by the diode CR21 as shown by the waveform c. The resistor R23 couples the rectified waveform c to the clipper diode CR22 and the (+) input of the integrator amplifier A21. The waveform d depicts the clipped voltage. Output of the amplifier A21 is an integrated waveform e and is applied to the (+) input of the comparator amplifier A22. An adjustable voltage for the (−) input to the comparator A22 is derived from the battery E11 and the capacitor C11. Waveform f shows these two inputs to the comparator A22. When the integrated voltage at (+) input of the comparator 22 exceeds the (−) input its output goes high. That high output functions as an SCR gate, which is coupled to the SCR Q12 causing it to trigger into conduction. The SCR gate is shown as the waveform g in FIG. 4. The point B on the waveform a is shown as the point at which conduction of the SCR Q12 is initiated. A lower battery voltage, whether due to increased load or lower line voltage, will cause earlier conduction (toward point A on waveform a) tending toward maintenance of system operating voltage and battery charge. Conversely, higher battery voltage, whether due to decrease load or higher line voltage, will cause later conduction (toward point C on waveform a), again maintaining system operating voltage and battery charge at desired levels. The waveform h depicts the battery, E11, voltage showing the increased voltage level at the point of conduction of the SCR Q12. Also shown in dotted lines is the voltage that would result from the other half 23 of the charge/voltage regulator 18 when the SCR Q11 conducts. The zener diode CR14 and the potentiometer R13 permit adjustment for an upper voltage limit to protect the battery E11 and the system from excessive line voltage.

As shown in FIG. 3, the operational amplifier A31, together with the diode CR31 and the resistors R32–R37 comprise a basic square wave oscillator 26. The frequency of oscillation is set by the variable timing resistor R33. Depicted in FIG. 5 is the basic oscillator waveform i. Assume first that the output of the amplifier A31 has just switched high. The voltage at the (+) input of the amplifier A31 increases and the timing capacitor C31 charges through the resistors R32 and R33 as shown by waveform k in FIG. 5. Voltage divider R36, R37 sets up a voltage at the (−) input of the amplifier A32 that is slightly lower than the (+) input of the amplifier A31. The output of the amplifier A32 then is low. When the timing capacitor C31 charge reaches a predetermined level that just exceeds the voltage at the (−) input of amplifier A32, the (−) output of the amplifier A32 goes high as shown by the waveform 1. Shortly after the output of the amplifier A32 goes high, the increasing voltage on the timing capacitor C31 reaches a given value that exceeds the voltage on the (+) input of amplifier A31 causing the output of amplifier A31 to go low as shown by the waveforms i and k. When the output of amplifier A31 goes low its (+) input switches to a lower voltage set up by the voltage divider R35-R37 and the capacitor C31 begins to discharge through the resistors R32, R33 as shown by waveforms j and k. The capacitor C31 continues discharging until the (−) input of amplifier A31 becomes lower than its (+) input at which point its output goes high. Simultaneously, the output of the amplifier A32 goes low as shown by waveforms i and l. The waveform l always hoes high slightly before the A31 oscillator output goes low and is differentiated by resistor R39 and capacitor C32 and unipolarized by the diode CR33 to create an early transition pulse shown by the waveforms m and n.

Up to this point, the oscillator 26 has been free running, with the period of oscillation determined by the timing capacitor C31, the timing resistors R32, R33 and the varying voltage on the (+) input of the amplifier A31. To achieve phase lock to 60 Hertz commercial power, a smooth transition between the free running state and locked operation occurs to avoid a disruptive oscillator output. Application of commercial AC power can occur anytime during the cycle generated by free-running oscillator 26. The waveforms o, p, q and r derived from the commercial power waveform, occur regardless of the phase relationship between the commercial power and the free running oscillator 26. When the free running oscillator 26 drifts to within a few degrees of the commercial power, the early transition pulse (waveform n) derived from the oscillator, and the Cross-over Pulse (waveform r) derived from commercial power, combine in an "and" gate producing a Sync Pulse (waveform s) locking the oscillator 26 to the commercial power as depicted by the waveform t. Phase lock insures that the transformer T2 and the charge/voltage regulator 18 will supply power in phase with maximum energy drawn by the supply 11. Thus, AC current through the capacitor C11 is reduced providing higher efficiency and greater reliability. In addition, any load operating in synchronism with the AC power line is not subjected to frequency "slippage" that can cause speed locking errors in motor drives and eye strain producing flicker in display terminals.

In explanation of the above series of events, first consider the waveforms o through r. The diode CR35 (FIG. 3) provides half wave rectification of the commercial power. This rectifier half cycle is converted to a square wave by the op amplifier A33 and differentiated by the RC network R45, C33. The diode CR39 removes the negative excursion of the differentiator network. Receiving the positive pulse corresponding to the cross-over point of the commercial power waveform (waveform r) and delivering a pulse out to the "and" gate formed by the resistors R41, R47, the diode CR34 and the diode CR40 is the op amplifier A34. Only when an Early Transition Pulse at the cathode of the diode CR34 (waveform n) coincides with the 60 Hertz Cross-over Pulse at the cathode of the diode 40 (waveform r) does an output occur from the "and" gate. That output activates the amplifier A35 which delivers a Sync Pulse (waveform s) through the transistor Q31 and the trigger resistor R31. The resultant voltage increase at the (−) input of the amplifier A31 causes switching thereof and thereby phase-locks its output to the AC supply voltage received by the transformer T2, as shown in waveform t. A three stage RC filter R50-52, C35-37 removes harmonics from the square wave and after amplification by the amplifier A36 a sine wave of waveform u is obtained. The amplifier A36 applies the sine wave u to the transformer T31 and the split rectifiers CR41 and CR43 generate the waveforms v and w of FIG. 5. These negative half cycle waveforms v and w are utilized to drive the switching network 11 of FIG. 1.

Figure 6A:
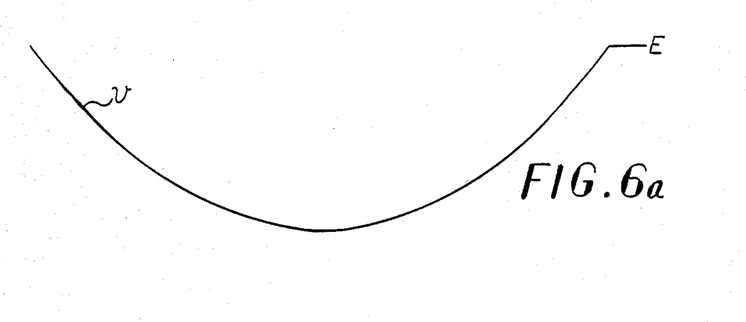
FIGS. 6a–6c are schematic diagrams illustrating other waveforms produced in the circuit shown in FIG. 1.
Figure 6B:
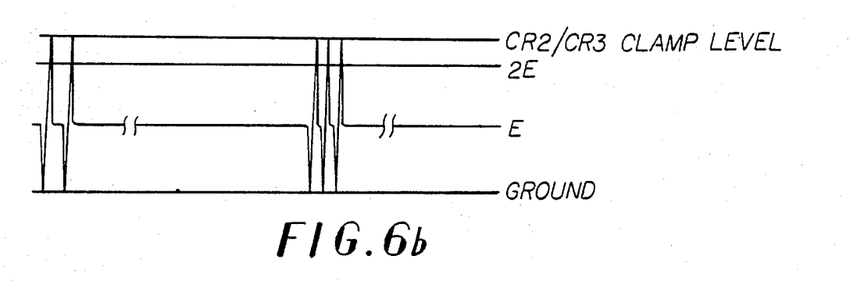
Figure 6C:
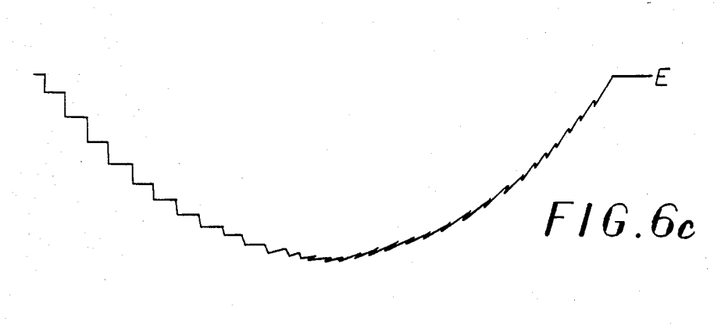

To more fully explain the operation of the switching transistor circuit 11 reference is now made to FIG. 1 and FIGS. 6a-6c. The comparator, A1 receives the reference input voltage v and the negative swing portion of the voltage present at the winding 14 of the transformer T1. As the comparator switches the transistor pair Q1, Q2 "on", the transistor Q2 is driven into saturation with a waveform as shown in FIG. 6b. When the winding 14 of the transformer T1 is pulled lower than the reference voltage v, the transistor pair Q1-Q2 is switched "off", and the magnetic field of the inductive coil L1 collapses, releasing its stored energy as an inductive kick. When the inductive kick voltage exceeds the break down voltage of the diodes CR2, CR3, current resumes flowing through the coil L1 and is shunted back into the power supply. Shortly thereafter the reference voltage v becomes more negative than the voltage at winding 14 of the transformer T1 and the transistor pair Q1-Q2 is again switched "on". This switching action slows down when a lighter load is present and speeds up for heavier loads, and may reach a 200 KHz rate. As shown in FIG. 6c, the voltage at the winding 14 of the transformer T1 has a switching frequency component. The capacitor C3 across the output of the transformer T1, serves to filter out the switching frequency energy.

Obviously, many modifications and variations of the present invention can be used to generate variable voltage waveforms other than full sine waves. Such other waveforms could be used, for example, to drive vibration analysis equipment, to power test equipment under adverse voltage conditions for frequency sweep testings of equipment to produce irregularly shaped harmonic stimulus for medical applications, for scientific experiments requiring harmonic non-sinusoid waveforms where even a momentary lapse of power could result in physical damage or costly interruptions, etc. Also, the invention can be easily modified to generate frequencies other than 60 Hertz. It is to be understood, therefore, that the invention can be practiced otherwise than as specifically described.

What is claimed is:
1. A phase-lock system comprising:
oscillator means providing a switching output that continuously switches between first and second states;
a trigger circuit for inducing said switching of said oscillator means;
a sensing circuit monitoring said switching output and providing an anticipating indication of an imminent switching thereof from said first to said second state;

primary voltage source means providing a variable voltage that periodically varies from and returns to a given voltage level;

a detector circuit monitoring said variable voltage and detecting the presence of said given voltage level; and a synchronizing circuit responsive to said sensing and detector circuits and providing an input to said trigger circuit, said synchronizing circuit operative to cause switching of said oscillator means in response to the simultaneous provision of said anticipating indication by said sensing circuit and detection of said given level by said detector circuit.

2. A system according to claim 1 including a filter circuit receiving said switching output and producing therein an AC output.

3. A system according to claim 2 wherein said variable voltage is an AC voltage.

4. A system according to claim 3 wherein both said AC output and said AC voltage comprise sine waves.

5. A system according to claim 4 wherein said given level is zero.

6. A system according to claim 1 wherein said oscillator means comprises a timing circuit for determining the periods of said first and second states, said timing circuit comprising a timing capacitor having one end connected to said switching output by timing resistor means and an opposite end connected to a trigger resistor, a given voltage across said timing capacitor and trigger resistor causing said switching of said oscillator, and said trigger circuit comprises an electronic switch means activatable to produce current flow through said trigger resistor, said electronic switch means being activated by said input from said synchronizing circuit.

7. A system according to claim 6 wherein said oscillator comprises an operational amplifier with an output providing said switching output and one input connected to said one end of said timing capacitor.

8. A system according to claim 7 wherein said sensing circuit comprises a threshold means for producing said anticipating indication as an early transition signal in response to a predetermined voltage across said timing capacitor and said trigger resistor, said predetermined voltage being slightly less than said given voltage.

9. A system according to claim 8 including a filter circuit receiving said switching output and producing therewith an a.c. output.

10. A system according to claim 9 wherein said variable voltage is an a.c. voltage.

11. A system according to claim 10 wherein both said a.c. output and said a.c. voltage comprise sine waves.

12. A system according to claim 11 wherein said given level is zero.

13. A system according to claim 12 wherein said detector circuit comprises means for producing a cross-over signal in response to certain zero-crossings of said AC voltage.

14. A system according to claim 13 wherein said transition signal is an early transition pulse, said cross-over signal comprises a cross-over pulse, and said synchronizing circuit comprises "and" gate means for providing said input as a sync pulse in response to the simultaneous reception of a said transition pulse and a said cross-over pulse.

15. A system according to claim 14 wherein said electronic switch means comprises a transistor triggered into conduction by said sync pulse.

* * * * *